United States Patent
Marchuk et al.

(10) Patent No.: US 11,613,697 B2
(45) Date of Patent: Mar. 28, 2023

(54) PHOSPHOR AND CONVERSION LED

(71) Applicant: OSRAM Opto Semiconductors GmbH, Regensburg (DE)

(72) Inventors: Alexey Marchuk, Munich (DE); Dominik Baumann, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 339 days.

(21) Appl. No.: 16/753,799

(22) PCT Filed: Sep. 27, 2018

(86) PCT No.: PCT/EP2018/076261
§ 371 (c)(1),
(2) Date: Apr. 6, 2020

(87) PCT Pub. No.: WO2019/068550
PCT Pub. Date: Apr. 11, 2019

(65) Prior Publication Data
US 2020/0255731 A1     Aug. 13, 2020

(30) Foreign Application Priority Data
Oct. 6, 2017   (DE) .................. 10 2017 123 269.9

(51) Int. Cl.
*C09K 11/77*     (2006.01)
*H01L 33/50*     (2010.01)

(52) U.S. Cl.
CPC ........ *C09K 11/7734* (2013.01); *H01L 33/502* (2013.01); *H01L 2933/0041* (2013.01)

(58) Field of Classification Search
CPC ............. C09K 11/7734; H01L 33/502; H01L 2933/0041
See application file for complete search history.

(56) References Cited

U.S. PATENT DOCUMENTS

| | | | |
|---|---|---|---|
| 4,216,408 A | 8/1980 | De Meester et al. | |
| 5,474,959 A | 12/1995 | Schaefer et al. | |
| 6,660,186 B2 | 12/2003 | Ravilisetty | |
| 2003/0122108 A1* | 7/2003 | Ravilisetty | C09K 11/7792 252/301.4 R |

(Continued)

FOREIGN PATENT DOCUMENTS

| | | |
|---|---|---|
| DE | 2353943 A1 | 5/1974 |
| DE | 4122586 C1 | 6/1992 |

(Continued)

OTHER PUBLICATIONS

International Search Report issued for the corresponding PCT-Application No. PCT/EP2018/076261, dated Feb. 4, 2020, 12 pages (for informational purpose only).

(Continued)

*Primary Examiner* — Jay C Chang
*Assistant Examiner* — Mikka Liu
(74) *Attorney, Agent, or Firm* — Viering, Jentschura & Partner Mbb

(57) ABSTRACT

A phosphor may have the empirical formula: $(AB)_{1+x+2y}Al_{11-x-y}(AC)_xLi_yO_{17}$:E, where $0<x+y<11$; AC=Mg, Ca, Sr, Ba and/or Zn; AB=Na, K, Rb, and/or Cs; and E=Eu, Ce, Yb, and/or Mn. The phosphor may be used in conversion LED components.

14 Claims, 13 Drawing Sheets

(56) References Cited

U.S. PATENT DOCUMENTS

2008/0191600 A1* 8/2008 Misawa ............... C09K 11/595
423/599
2018/0155618 A1* 6/2018 Sista .................... C09K 11/616

FOREIGN PATENT DOCUMENTS

EP   1854861 A1   11/2007
EP   1860172 A1   11/2007

OTHER PUBLICATIONS

German Search Report issued for the corresponding DE-Application No. 10 2017 123 269.9, dated Jun. 7, 2018 (for informational purpose only).

A.P. Brown, "Site-selective fluorescence spectroscopy of Eu(III) β"-alumina", Journal of Solid State Chemistry, Sep. 1992, pp. 49-61, vol. 100, Issue 1.

Saltzberg et al., "Luminescence and order-disorder effects in Eu(II)-β"-alumina", Materials Research Bulletin, Dec. 1986, pp. 1533-1538, vol. 21, Issue 12.

Brown et al., "Structures of four fast-ion conductors by single-crystal neutron-diffraction analysis: Zn-stabilized Naβ"-Alumina and Mg-stabilized Na-, K-, and Agβ"-aluminas", Solid State Ionics, Oct. 1981, pp. 147-150, vol. 5.

* cited by examiner

FIG 1

| | |
|---|---|
| sum formula | $Na_{1+x+2y}Al_{11-x-y}Zn_xLi_yO_{17}$ |
| crystal system | trigonal |
| space group | $R\bar{3}m$ (no 166) |
| a / Å | 5.6105(1) |
| c / Å | 33.6092(7) |
| cell volume / Å³ | 916.20(2) |
| density / g × cm⁻³ | 3.3397 |
| T / K | 293(2) |
| diffractometer | Bruker D8 Quest |
| radiation | Cu-K$\alpha$ ($\lambda$=1.54184) |
| measurement range | $3.95 < \theta < 71.23$ |
| | $-6 \le h \le 6$ |
| | $-6 \le k \le 6$ |
| | $-40 \le l \le 40$ |
| reflexions total | 2551 |
| independent reflexions | 236 |
| $R_1, wR_2$ ($I \ge 2\sigma I$) | 0.0263, 0.0345 |
| GooF | 2.15 |

FIG 2

| atom | x | y | z | occupation |
|---|---|---|---|---|
| Na1 | 0.07400 | 0.92600 | 0.33020 | 0.2 |
| Na2 | 1/3 | 2/3 | 0.34110 | 0.404 |
| Al1 | 1/3 | 2/3 | 1/6 | 1.0 |
| Al2 | 0.16592 | 0.83408 | 0.23755 | 1.0 |
| Al3 | 2/3 | 4/3 | 0.28310 | 1.0 |
| Al4 | -1/3 | 1/3 | 0.18329 | 0.938 |
| Li4 | -1/3 | 1/3 | 0.18329 | 0.062 |
| O1 | 2/3 | 4/3 | 1/3 | 1.0 |
| O2 | 0 | 1 | 0.20466 | 1.0 |
| O3 | 1/3 | 2/3 | 0.26362 | 1.0 |
| O4 | 0.02280 | 0.51140 | 0.20091 | 1.0 |
| O5 | 0.32550 | 1.16270 | 0.26498 | 1.0 |

|  | | Na | Al | Zn | O |
|---|---|---|---|---|---|
| EDX 1 | [atom %] | 5.58 | 30.64 | 1.08 | 62.70 |
| EDX 2 | [atom %] | 3.42 | 29.82 | 1.69 | 65.06 |
| EDX 3 | [atom %] | 4.66 | 31.90 | 1.09 | 62.34 |

FIG 11

| | $Na_{2.3}Al_{10}Zn_{0.7}Li_{0.3}O_{17}:Eu^{2+}$ | $Lu_3(Al,Ga)_5O_{12}:Ce^{3+}$ | $(Sr,Ba)_2SiO_4:Eu^{2+}$ |
|---|---|---|---|
| CIE-x | 0.323 | 0.328 | 0.328 |
| CIE-y | 0.633 | 0.572 | 0.619 |
| $QE_r$ /% | 110 | 100 | 100 |
| LER / lm $W_{opt}^{-1}$ | 541.9 | 449.4 (−17%) | 508.4 (−6%) |
| $\lambda_{dom}$ /nm | 552.8 | 553.4 | 553.6 |
| FWHM / nm | 64.9 | 102.0 (+36%) | 71.9 (+10%) |
| color purity % | 88.0 | 70.9 | 85.2 |

FIG 13

| sum formula | $Na_{2.1}Al_{10.2}Mg_{0.5}Li_{0.3}O_{17}$ |
|---|---|
| crystal system | trigonal |
| space group | $R\bar{3}m$ (no 166) |
| a / Å | 5.6149(1) |
| c / Å | 33.6149(1) |
| cell volume / Å$^3$ | 922.15(4) |
| density / g × cm$^{-3}$ | 3.307 |
| T / K | 293(2) |
| diffractometer | Bruker D8 Quest |
| radiation | Cu-K$\alpha$ ($\lambda$=1.54184) |
| measurement range | 7.871° < $\theta$ < 72.301° |
| | $-6 \leq h \leq 6$ |
| | $-6 \leq k \leq 6$ |
| | $-40 \leq l \leq 40$ |
| reflexions total | 3448 |
| independent reflexions | 269 |
| $R_1$, $wR_2$ ($I \geq 2\sigma I$) | 0.0218, 0.0738 |
| GooF | 1.352 |

FIG 14

| atom | x | y | z | occupation |
|---|---|---|---|---|
| Na1 | 2/3 | 1/3 | 0.50766 | 0.525 |
| Na2 | 0.58480 | 0.41520 | 0.50160 | 0.158 |
| Al1 | 2/3 | 1/3 | 1/3 | 1.0 |
| Al2 | 0.49905 | 0.50095 | 0.40401 | 1.0 |
| Al3 | 1/3 | 2/3 | 0.31650 | 0.5 |
| Mg3 | 1/3 | 2/3 | 0.31650 | 0.5 |
| Al4 | 0 | 0 | 0.44993 | 1.0 |
| O1 | 2/3 | 1/3 | 0.42972 | 1.0 |
| O2 | 1/3 | 2/3 | 0.37117 | 1.0 |
| O3 | 0.51223 | 0.48777 | 0.29924 | 1.0 |
| O4 | 0.16983 | 0.33970 | 0.43117 | 1.0 |
| O5 | 0 | 0 | 1/2 | 1.0 |

|  | Na | Al | Mg | O |
|---|---|---|---|---|
| EDX 1 [atom %] | 4.18 | 31.93 | 1.42 | 62.47 |
| EDX 2 [atom %] | 3.74 | 33.93 | 1.39 | 60.94 |
| EDX 3 [atom %] | 4.34 | 29.98 | 1.20 | 64.48 |

FIG 21

| | $Na_{2.1}Al_{10.2}Mg_{0.5}Li_{0.3}O_{17}:Eu^{2+}$ | $Lu_3(Al,Ga)_5O_{12}:Ce^{3+}$ | $SrSi_2O_2N_2:Eu^{2+}$ |
|---|---|---|---|
| CIE-x | 0.374 | 0.374 | 0.368 |
| CIE-y | 0.599 | 0.562 | 0.586 |
| $QE_i$ /% | 100 | 100 | 89 |
| LER / lm W$_{opt}^{-1}$ | 547.7 | 483.2 (−12%) | 520.9 (−5%) |
| $\lambda_{dom}$ / nm | 560.6 | 561.4 | 562.4 |
| FWHM / nm | 69.7 | 110.1 (+37%) | 80.9 (+14%) |
| color purity % | 92.5 | 81.2 | 92.1 |

PHOSPHOR AND CONVERSION LED

CROSS-REFERENCE TO RELATED APPLICATION

The present application is a national stage entry according to 35 U.S.C. § 371 of PCT application No.: PCT/EP2018/076261 filed on Sep. 27, 2018; which claims priority to German Patent Application Serial No.: 10 2017 123 269.9, which was filed on Oct. 6, 2017; which are incorporated herein by reference in their entirety and for all purposes.

TECHNICAL FIELD

The description relates to a phosphor, to a process for preparing a phosphor and to a conversion LED.

BACKGROUND

Phosphors that can be excited efficiently with ultraviolet and/or blue primary radiation and have efficient emission in the green spectral region are of great interest for the production of white and colored conversion LEDs. Conversion LEDs are used, for example, for general lighting.

It is an object to specify a phosphor that emits radiation in the green region of the electromagnetic spectrum. A further object is that of providing a process for preparing a phosphor that emits radiation in the green region of the electromagnetic spectrum, and that of providing a conversion LED including a phosphor that emits radiation in the blue to green region of the electromagnetic spectrum.

SUMMARY

A phosphor having the empirical formula $(AB)_{1+x+2y}Al_{11-x-y}(AC)_xLi_yO_{17}:E$ is specified. In the phosphor:
  $0<x+y<11$,
  AC=Mg, Ca, Sr, Ba and/or Zn,
  AB=Na, K, Rb and/or Cs, and
  E=Eu, Ce, Yb and/or Mn. In a non-limiting embodiment,
  $x>0$ and
  $y>0$. In the embodiment, the phosphor thus contains both AC=Mg, Ca, Sr, Ba and/or Zn and Li. Phosphors according to this embodiment emit particularly efficiently especially in the green spectral region.

Here and hereinafter, phosphors are described by empirical formulae. In the empirical formulae reported, it is possible that the phosphor includes further elements, for instance in the form of impurities, where these impurities together should have not more than a proportion by weight of the phosphor of at most 1 permille or 100 ppm (parts per million) or 10 ppm.

In at least one embodiment, the phosphor has the following general empirical formula:
$(AB)_{1+x+2y}Al_{11-x-y}(AC)_xLi_yO_{17}:Eu$ where:
  $0<x+y<11$,
  AC=Mg, Ca, Sr, Ba and/or Zn, and
  AB=Na, K, Rb and/or Cs. In a non-limiting embodiment,
  $x>0$ and
  $y>0$.

The inventors have found that Eu-doped phosphors are particularly efficient.

The inventors have surprisingly succeeded in providing a phosphor which is derived from an alkali metal aluminate and which contains within its empirical formula not only alkali metal ions (Na, K, Rb and/or Cs) and aluminum ions but also lithium ions and/or divalent cations, such as lithium ions and divalent cations, and especially crystallizes to give a crystal structure isotypic to sodium β"-aluminate. By virtue of doping with an activator E (E=Eu, Ce, Yb and/or Mn), such as Eu, e.g. $Eu^{2+}$, the phosphor, after excitation with primary radiation in the blue or near UV region, can emit radiation in the blue to green, such as in the green, region of the electromagnetic spectrum.

What is meant more particularly by the fact that two compounds crystallize in an isotypic crystal structure is that the atoms of one compound occupy the same site within the crystal structure as the corresponding atoms of the other compound. As a result, the linkages of components within the structure remain unchanged.

In at least one embodiment, the phosphor has the empirical formula $(AB)_{1+2y}Al_{11-y}Li_yO_{17}:E$. In the phosphor:
  $0<y<11$,
  AB=Na, K, Rb and/or Cs, and
  E=Eu, Ce, Yb and/or Mn. In a non-limiting embodiment,
  $0<y<1$,
  AB=Na and
  E=Eu.

In at least one embodiment, the phosphor has the empirical formula $(AB)_{1+x}Al_{11-x}(AC)_xO_{17}:E$. In the phosphor:
  $0<x<11$,
  AC=Mg, Ca, Sr, Ba and/or Zn,
  AB=Na, K, Rb and/or Cs, and
  E=Eu, Ce, Yb and/or Mn. In a non-limiting embodiment:
  $0<x<1$,
  AC=Mg and/or Zn,
  AB=Na and
  E=Eu.

Phosphors according to this embodiment especially show emission in the blue spectral region with a peak wavelength between 470 nm and 500 nm.

"Peak wavelength" in the present context refers to the wavelength in the emission spectrum at which the maximum intensity in the emission spectrum lies.

In at least one embodiment, the peak wavelength of the phosphor lies in the green region of the electromagnetic spectrum, such as between 520 nm and 560 nm, e.g. between 525 nm and 550 nm. Green-emitting phosphors are required for a multitude of applications, for example for conversion LEDs for general lighting.

In at least one embodiment, the phosphor has the formula $(AB)_{1+x+2y}Al_{11-x-y}(AC)_xLi_yO_{17}:E$ where
  $0<x+y<2$, such as $0.5 \leq x+y \leq 1.5$,
  $x>0$,
  $y>0$,
  AC=Mg, Ca, Sr, Ba and/or Zn,
  AB=Na, K, Rb and/or Cs and
  E=Eu, Ce, Yb and/or Mn, such as E=Eu. AC and Li may especially partly occupy two Al lattice sites within the crystal structure. An alternative notation for the empirical formula of the phosphor that illustrates the partial substitution of two aluminum ions for AC and Li is $(AB)_{1+x+2y}Al_9(Al_{2-x-y})(AC)_xLi_yO_{17}:Eu$. Phosphors containing both AC and Li, by comparison with phosphors containing AC or Li only, surprisingly show a peak wavelength shifted into the long-wave region and especially emit in the green region of the electromagnetic spectrum.

The phosphors are very stable and especially have high quantum efficiency. The phosphors have high absorption capacity in the near UV region to blue region, and hence can be excited efficiently with primary radiation in this wavelength range. The primary radiation may be converted by the phosphor wholly (full conversion) or partly (partial conversion) to a longer-wave radiation, also called secondary radiation. Moreover, the half-height width may be below 75 nm. The half-height width is very small compared to that of known green phosphors, for example $Lu_3Al_5O_{12}$:Ce. Owing to the small half-height width, it is possible to achieve high color purity, and to increase the efficiency and the light yield of a conversion LED containing the phosphor.

The half-height width is understood here and hereinafter to mean the spectral weight at half the height of the maximum of the emission peak, FWHM or full width at half maximum for short. The emission peak is regarded as the peak having the maximum intensity.

The inventors have found that, surprisingly, the presence of Li and AC in the phosphor is essential for the good optical properties, especially the position of the peak wavelength in the green region of the electromagnetic spectrum and the small half-height width. For example, $Na_{1.72}Li_{0.3}Al_{10.66}O_{17}$:$Eu^{2+}$ and $Na_{1.57}Zn_{0.57}Al_{10.43}O_{17}$:$Eu^{2+}$, by comparison with $Na_{1+x+2y}Al_{11-x-y}Zn_xLi_yO_{17}$:Eu with x=0.7 and y=0.3, has a peak wavelength shifted to shorter wavelengths and a greater half-height width.

In at least one embodiment, the phosphor has the empirical formula $Na_{1+x+2y}Al_{11-x-y}(AC)_xLi_yO_{17}$:E where
0<x+y<11, such as 0<x+y<2, e.g. 0.5≤x+y≤1.5,
x>0,
y>0,
AC=Mg, Ca, Sr, Ba and/or Zn and
E=Eu, Ce, Yb and/or Mn, such as E=Eu.

$Na_{1+x+2y}Al_{11-x-y}(AC)_xLi_yO_{17}$:E or $Na_{1+x+2y}Al_{11-x-y}(AC)_xLi_yO_{17}$:Eu derives especially from sodium β"-aluminate and has, by comparison with sodium-β"-aluminate, with its empirical formula, not only sodium and aluminum ions but also lithium ions and zinc, magnesium, calcium, strontium and/or barium ions. More particularly, the phosphor crystallizes in a crystal structure isotypic to sodium β"-aluminate. Within the crystal structure, it is possible for Li and AC in particular of the phosphor to assume the same lattice site within the crystal structure as Al in sodium β"-aluminate. Al, AC and Li thus especially occupy a crystallographic position.

In at least one embodiment, the phosphor has the empirical formula $Na_{1+x+2y}Al_{11-x-y}(Zn_{1-z}A_z)_xLi_yO_{17}$:E where
0≤z<1, such as 0≤z<0.5,
0<x+y<11, such as 0<x+y<2, e.g. 0.5≤x+y≤1.5,
x>0,
y>0,
A=Mg, Ca, Sr and/or Ba and
E=Eu, Ce, Yb and/or Mn, such as E=Eu.

In at least one embodiment, the phosphor has the empirical formula $Na_{1+x+2y}Al_{11-x-y}(Zn_{1-z}A_z)_xLi_yO_{17}$:Eu where
0≤z<1, such as 0≤z<0.5,
0<x+y<11, such as 0<x+y<2, e.g. 0.5≤x+y≤1.5,
x>0,
y>0, and
A=Mg, Ca, Sr and/or Ba.

In at least one embodiment, the phosphor has the empirical formula $Na_{1+x+2y}Al_{11-x-y}Zn_xLi_yO_{17}$:E or $Na_{1+x+2y}Al_{11-x-y}Zn_xLi_yO_{17}$:Eu where
0<x+y<11, such as 0<x+y<2, e.g. 0.5≤x+y≤1.5,
x>0,
y>0 and
E=Eu, Ce, Yb and/or Mn.

In at least one embodiment, the phosphor has the empirical formula $Na_{1+x+2y}Al_{11-x-y}Zn_xLi_yO_{17}$:E or $Na_{1+x+2y}Al_{11-x-y}Zn_xLi_yO_{17}$:Eu where
0<x+y<2, such as 0.5≤x+y≤1.5,
0.2<x<1
0.1<y<0.5,
E=Eu, Ce, Yb and/or Mn. For example, x=0.7 and y=0.3.

In at least one embodiment, the phosphor has the empirical formula $Na_{1+x+2y}Al_{11-x-y}(Mg_{1-z}A'_z)_xLi_yO_{17}$:Eu where
0≤z'<1, such as 0≤z'<0.5
0<x+y<11, such as 0<x+y<2, such as 0.5≤x+y≤1.5,
x>0,
y>0,
A'=Zn, Ca, Sr and/or Ba and
E=Eu, Ce, Yb and/or Mn.

In at least one embodiment, the phosphor has the empirical formula $Na_{1+x+2y}Al_{11-x-y}(Mg_{1-z}A'_z)_xLi_yO_{17}$:Eu where
0≤z'<1, such as 0≤z'<0.5
0<x+y<11, such as 0<x+y<2, such as 0.5≤x+y≤1.5,
x>0,
y>0, and
A'=Zn, Ca, Sr and/or Ba.

In at least one embodiment, the phosphor has the empirical formula $Na_{1+x+2y}Al_{11-x-y}Mg_xLi_yO_{17}$:E or $Na_{1+x+2y}Al_{11-x-y}Mg_xLi_yO_{17}$:Eu where
0<x+y<11, such as 0<x+y<2, e.g. 0.5≤x+y≤1.5,
x>0,
y>0 and
E=Eu, Ce, Yb and/or Mn.

In at least one embodiment, the phosphor has the empirical formula $Na_{1+x+2y}Al_{11-x-y}Mg_xLi_yO_{17}$:E or $Na_{1+x+2y}Al_{11-x-y}Mg_xLi_yO_{17}$:Eu where
0<x+y<2, such as 0.5≤x+y≤1.5,
0.2<x<1
0.1<y<0.5
and
E=Eu, Ce, Yb and/or Mn. For example, y=0.3 and x=0.5.

In at least one embodiment, the phosphor crystallizes in a trigonal crystal system.

In at least one embodiment, the phosphor crystallizes in a $R\overline{3}$ m space group. The phosphor crystallizes in a trigonal crystal system with the $R\overline{3}$ m space group.

The specified embodiments of the phosphor may be prepared by processes specified hereinafter. All features described for the phosphor are thus also applicable to the process for preparation thereof, and vice versa.

A process for preparing a phosphor is specified. The phosphor has the formula
$(AB)_{1+x+2y}Al_{11-x-y}(AC)_xLi_yO_{17}$:E where
0<x+y<11
AC=Mg, Ca, Sr, Ba and/or Zn and
AB=Na, K, Rb and/or Cs. In a non-limiting embodiment:
x>0 and
y>0.

The process includes the following process steps:

A) blending reactants of the phosphor,
B) heating the blend obtained in A) to a temperature T1 between 1200 and 1800° C., such as between 1400° C. and 1650° C.,
C) calcining the blend at a temperature T1 between 1200 and 1800° C., such as between 1400° C. and 1650° C., for 6 hours to 15 hours.

In at least one embodiment, the reactants used in process step A) are $(AB)_2CO_3$, $Li_2CO_3$, $Al_2O_3$, (AC)O and $Eu_2O_3$, where AC=Mg, Ca, Sr, Ba and/or Zn and AB=Na, K, Rb and/or Cs. The reactants may especially be used in powder form. More particularly, this forms a phosphor of the following general empirical formula:

$(AB)_{1+x+2y}Al_{11-x-y}(AC)_xLi_yO_{17}$:Eu where:
  $0<x+y<11$,
  $x>0$,
  $y>0$,
  AC=Mg, Ca, Sr, Ba and/or Zn, and
  AB=Na, K, Rb and/or Cs.

In one embodiment, process step C) is followed by a further process step:
D) cooling the blend to room temperature. Room temperature is especially understood to mean 20° C.

In one embodiment, process steps D), C) and B) are performed under a forming gas atmosphere, especially with 7.5% $H_2$ and 92.5% $N_2$.

In one embodiment, process step D) is again followed by process steps B) and C), in which case the phosphor obtained in process step D) is heated or calcined. This further calcining operation can improve the optical properties of the phosphor.

The process for preparation is very simple to conduct compared to many other preparation processes for phosphors. More particularly, no protective gas atmosphere is required since the reactants and the result phosphor are moisture- or oxygen-insensitive. The reactants are commercially available inexpensively, which also makes the phosphor one of economic interest.

A conversion LED (conversion light-emitting diode) including a phosphor is specified. The specified embodiments of the phosphor may be present in a conversion LED as described hereinafter. All features described for the phosphor are thus also applicable to the phosphor in the conversion LED and vice versa.

A conversion LED is specified. The conversion LED includes a primary radiation source that emits electromagnetic primary radiation in the operation of the component, and a conversion element including a phosphor. The conversion element is disposed in the beam path of the electromagnetic primary radiation and the phosphor is set up to at least partly convert the electromagnetic primary radiation to electromagnetic secondary radiation. The phosphor has the formula
$(AB)_{1+x+2y}Al_{11-x-y}(AC)_xLi_yO_{17}$:E where
  $0<x+y<11$,
  AC=Mg, Ca, Sr, Ba and/or Zn,
  AB=Na, K, Rb and/or Cs, and
  E=Eu, Ce, Yb and/or Mn. In a non-limiting embodiment, $x>0$ and
  $y>0$.

The fact that the phosphor converts the electromagnetic primary radiation at least partly to electromagnetic secondary radiation may mean firstly that the electromagnetic primary radiation is partly absorbed by the phosphor and emitted as secondary radiation with a wavelength range at least partly different, especially longer, than the primary radiation. In this "partial conversion", the conversion LED especially emits total radiation composed of the primary radiation and the secondary radiation. It is thus possible that the conversion LED emits mixed radiation composed of primary radiation and secondary radiation.

The fact that the phosphor at least partly converts the electromagnetic primary radiation to electromagnetic secondary radiation may also mean that the electromagnetic primary radiation is virtually completely absorbed by the phosphor and released in the form of electromagnetic secondary radiation. This can also be referred to as full conversion. The radiation or total radiation emitted by the conversion LED in this embodiment thus corresponds entirely or virtually entirely to the electromagnetic secondary radiation. Virtually full conversion is understood to mean conversion of more than 90%, especially more than 95%. It is thus possible that the conversion LED emits predominantly secondary radiation.

In at least one embodiment, the primary radiation source is a layer sequence having an active layer set up to emit electromagnetic primary radiation in the operation of the conversion LED.

"Layer sequence" in this connection is understood to mean a layer sequence including more than one layer, for example a sequence of a p-doped and an n-doped semiconductor layer, wherein the layers are arranged one on top of the other and wherein at least one active layer that emits electromagnetic primary radiation is present.

The layer sequence may be executed as an epitaxial layer sequence or as a radiation-emitting semiconductor chip with an epitaxial layer sequence, i.e. as an epitaxially grown semiconductor layer sequence. It is possible here for the layer sequence to be executed, for example, on the basis of InGaAlN. InGaAlN-based semiconductor chips and semiconductor layer sequences are especially those in which the epitaxially produced semiconductor layer sequence has a layer sequence composed of different individual layers containing at least one single layer including a material composed of the III-V compound semiconductor material system $In_xAl_yGa_{1-x-y}N$ with $0\le x\le 1$, $0\le y\le 1$ and $x+y\le 1$. Semiconductor layer sequences having at least one active layer based on InGaAlN can emit electromagnetic radiation, for example, in an ultraviolet to blue wavelength region.

The active semiconductor layer sequence may, as well as the active layer, include further functional layers or functional regions, for instance p- or n-doped charge carrier transport layers, i.e. electron or hole transport layers, undoped or p- or n-doped confinement, cladding or waveguide layers, barrier layers, planarization layers, buffer layers, protective layers and/or electrodes and combinations thereof. In addition, for example, on a side of the semiconductor layer sequence remote from the growth substrate, one or more mirror layers may be applied. The structures described here with regard to the active layer or the further functional layers and regions are known to the person skilled in the art, especially in terms of construction, function and structure, and therefore will not be elucidated in detail at this point.

In one embodiment, the electromagnetic primary radiation of the primary radiation source or the active layer of the layer sequence lies in the near UV region to blue region of the electromagnetic spectrum. "In the near UV region" can mean here that the primary radiation emitted has a wavelength between 300 nm and 420 nm inclusive. "In the blue region of the electromagnetic spectrum" may mean here that the primary radiation emitted has a wavelength between 420 nm and 500 nm inclusive. More particularly, it has been found that the phosphor absorbs electromagnetic primary radiation particularly efficiently in the blue region.

In at least one embodiment, the primary radiation source or the layer sequence has a radiation exit surface over which the conversion element is arranged.

What may be meant here and hereinafter by the fact that a layer or an element is arranged or mounted "on" or "over" another layer or another element is that one layer or one element is arranged in direct mechanical and/or electrical contact with the other layer or other element. What it may also mean is that one layer or one element is arranged indirectly on or above the other layer or another element. In that case, there may be further layers and/or elements between one or the other layer or between one or the other element.

The radiation exit surface here is a main surface of the primary radiation source or of the layer sequence. The radiation exit surface especially extends parallel to a main plane of extension of the semiconductor layers of the layer sequence. For example, at least 75% or 90% of the primary radiation leaving the layer sequence exits the layer sequence via the radiation exit surface.

In one embodiment, the conversion element has direct mechanical contact with the primary radiation source or the layer sequence, especially with the radiation exit surface of the primary radiation source or of the layer sequence.

In one embodiment, the conversion element is arranged completely over the primary radiation source or layer sequence, especially the radiation exit surface of the primary radiation source or layer sequence.

The conversion of the UV or blue primary radiation by the phosphor $(AB)_{1+x+2y}Al_{11-x-y}(AC)_xLi_yO_{17}$:E, such as $(AB)_{1+x+2y}Al_{11-x-y}(AC)_xLi_yO_{17}$:Eu, results in a secondary radiation having a peak wavelength in the blue to green region of the electromagnetic spectrum, such as in the green region of the electromagnetic spectrum, especially between 520 nm and 560 nm. This is thus very close to the maximum eye sensitivity at 555 nm, as a result of which the secondary radiation has a high overlap with the eye sensitivity curve and hence is perceived as being bright. As a result, conversion LEDs including the phosphor can advantageously have a high efficiency.

In order to produce white total radiation from the conversion LED, the conversion element may include a second phosphor that may be set up to convert the electromagnetic primary radiation and/or the electromagnetic secondary radiation which is emitted by the phosphor $(AB)_{1+x+2y}Al_{11-x-y}(AC)_xLi_yO_{17}$:E, such as $(AB)_{1+x+2y}Al_{11-x-y}(AC)_xLi_yO_{17}$:Eu, in operation of the conversion LED partly to electromagnetic secondary radiation in the red region of the electromagnetic spectrum. Superposition of blue primary radiation and the green and red secondary radiation produces a white light impression.

The second phosphor having a peak wavelength in the red spectral region may, for example, be a nitridosilicate or a nitridoaluminate. More particularly, the nitridosilicate may be selected from the material systems $(Ca,Sr,Ba,Eu)_2(Si,Al)_5(N,O)_8$, $(Ca,Sr,Ba,Eu)AlSi(N,O)_3$, $(Ca,Sr,Ba,Eu)AlSi(N,O)_3 \cdot Si_2N_2O$, $(Ca,Sr,Ba,Eu)_2Si_5N_8$, $(Ca,Sr,Ba,Eu)AlSiN_3$ and combinations thereof. The nitridoaluminate may have the formula $MLiAl_3N_4$:Eu (M=Ca,Sr).

In addition, the second phosphor may be selected from a material system having a peak wavelength in the red spectral region which is described in patent application WO 2015/052238 A1, the disclosure content of which is hereby fully incorporated by reference in that respect. For example, the second phosphor has the formula $Sr(Sr, Ca)Si_2Al_2N_6$:Eu.

The second phosphor having a peak wavelength in the red spectral region may also be a phosphor having the empirical formula $A_2[SiF_6]$:Mn$^{4+}$ with A=Li, Na, K, Rb, Cs, for example $K_2SiF_6$:Mn$^{4+}$.

The second phosphor having a peak wavelength in the red spectral region may also be $Mg_4GeO_{5.5}F$:Mn.

In one embodiment, the conversion element includes a matrix material. The phosphor, or the phosphor and the second phosphor, may be distributed in the matrix material; for example, it is distributed homogeneously in the matrix material.

The matrix material is transparent both to the primary radiation and to the secondary radiation and is selected, for example, from a group of materials consisting of: glasses, silicones, epoxy resins, polysilazanes, polymethacrylates and polycarbonates and combinations thereof. "Transparent" is understood to mean that the matrix material is at least partly transparent to the primary radiation and to the secondary radiation.

In one embodiment, the phosphors are particles of the corresponding phosphor. The particles of the phosphors may independently have an average grain size between 1 μm and 50 μm, such as between 5 μm and 40 μm, e.g. between 8 μm and 35 μm, or between 8 μm and 30 μm. With these grain sizes, the primary radiation or secondary radiation is advantageously scattered to a minor degree and/or mainly in forward direction by these particles, which reduces efficiency losses.

In one embodiment, the conversion element consists of the phosphor and the matrix material, or the phosphor and the second phosphor and the matrix material.

The conversion LED may include a housing. A recess may be present in the middle of the housing. The primary radiation source or layer sequence may be mounted in the recess. It is also possible that one or more further primary radiation sources or layer sequences is/are mounted in the recess.

It is possible that the recess is filled with an encapsulation that covers the primary radiation source or layer sequence. The recess may alternatively consist of an air space.

In one embodiment, the conversion element is part of an encapsulation of the primary radiation source or of the layer sequence, or the conversion element forms the encapsulation.

In one embodiment, the conversion element takes the form of a layer. The layer may be disposed above the radiation exit surface of the primary radiation source or of the layer stack or above the radiation exit surface and the lateral faces of the primary radiation source or of the layer sequence.

Owing to the excellent optical properties of the phosphor $(AB)_{1+x+2y}Al_{11-x-y}(AC)_xLi_yO_{17}$:E, especially $(AB)_{1+x+2y}Al_{11-x-y}(AC)_xLi_yO_{17}$:Eu, such as a high quantum efficiency, high light yield, emission with a small half-height width, good color rendering and color purity, conversion LEDs including this phosphor are suitable for many lighting applications, for example for general lighting and street lighting, and also for the backlighting of display elements such as displays.

WORKING EXAMPLES

The first working example (WE1) of the phosphor has the empirical formula $Na_{1+x+2y}Al_{11-x-y}Zn_xLi_yO_{17}$:Eu$^{2+}$ (2 mol % of Eu$^{2+}$) with x=0.7 and y=0.3 and hence the formula $Na_{2.3}Al_{10}Zn_{0.7}Li_{0.3}O_{17}$:Eu$^{2+}$ and is prepared as follows: $Na_2CO_3$, $Li_2CO_3$, ZnO, $Al_2O_3$ and $Eu_2O_3$ are mixed vigorously and calcined in a corundum crucible in a kiln at temperatures between 1400° C. and 1650° C. under forming gas atmosphere ($N_2$:$H_2$=92.5:7.5) for ten hours and then cooled. A green/yellow product is obtained. The starting weights of the reactants can be found in table 1 below. Further heating under the same forming gas atmosphere and at temperatures below the melting point of phosphor can be conducted in order to further improve the optical properties of the phosphor. In the present case, the synthesis of the phosphor was not optimized.

TABLE 1

| Reactant | Molar amount/mmol | Mass/g |
|---|---|---|
| $Na_2CO_3$ | 81.15 | 8.601 |
| $Li_2CO_3$ | 10.58 | 0.782 |
| ZnO | 49.40 | 4.020 |
| $Al_2O_3$ | 352.8 | 35.96 |
| $Eu_2O_3$ | 0.418 | 0.147 |

The reactants of the phosphor are commercially available and stable, and additionally very inexpensive. The simple synthesis means that the phosphor is also very inexpensive to produce and hence also economically attractive.

The phosphor of the first working example (WE1) shows emission in the green spectral region of the electromagnetic spectrum with a peak wavelength at 535 nm and a half-height width of about 65 nm.

The second working example (WE2) of the phosphor has the empirical formula $Na_{1+x+2y}Al_{11-x-y}Mg_xLi_yO_{17}:Eu^{2+}$ (2 mol % of $Eu^{2+}$) with x=0.5 and y=0.3 and hence the formula $Na_{2.1}Al_{10.2}Mg_{0.5}Li_{0.3}O_{17}:Eu^{2+}$ and is prepared as follows: $Na_2CO_3$, $Li_2CO_3$, MgO, $Al_2O_3$ and $Eu_2O_3$ are mixed vigorously and calcined in a corundum crucible in a kiln at temperatures between 1400° C. and 1650° C. under forming gas atmosphere ($N_2:H_2$=92.5:7.5) for five to ten hours and then cooled. A green/yellow product is obtained. The starting weights of the reactants can be found in table 2 below. Further heating under the same forming gas atmosphere and to temperatures below the melting point of the phosphor may be conducted in order to further improve the optical properties of the phosphor. The synthesis of the phosphor was not optimized in the present case.

TABLE 2

| Reactant | Molar amount/mmol | Mass/g |
|---|---|---|
| $Na_2CO_3$ | 78.21 | 8.289 |
| $Li_2CO_3$ | 11.18 | 0.826 |
| MgO | 37.24 | 1.501 |
| $Al_2O_3$ | 379.86 | 38.730 |
| $Eu_2O_3$ | 1.861 | 0.655 |

The reactants of the phosphor are commercially available and stable and additionally very inexpensive. The simple synthesis at comparatively low temperatures makes the phosphor very inexpensive to produce and hence also economically attractive.

The phosphor of the second working example (WE2) shows emission in the green spectral region of the electromagnetic spectrum with a peak wavelength at 543 nm and a half-height width of about 70 nm. The empirical formula was confirmed by means of ICP-MS (inductively coupled plasma mass spectroscopy).

BRIEF DESCRIPTION OF THE DRAWINGS

Further advantageous embodiments and developments are apparent from the working examples described hereinafter in conjunction with the figures.

FIGS. 1, 2, 13, 14 show characteristic properties of working examples of the phosphor, FIGS. 11 and 21 show comparisons of optical properties of working examples of phosphor with comparative examples.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or to afford a better understanding.

DETAILED DESCRIPTION

Figures 3, 4:
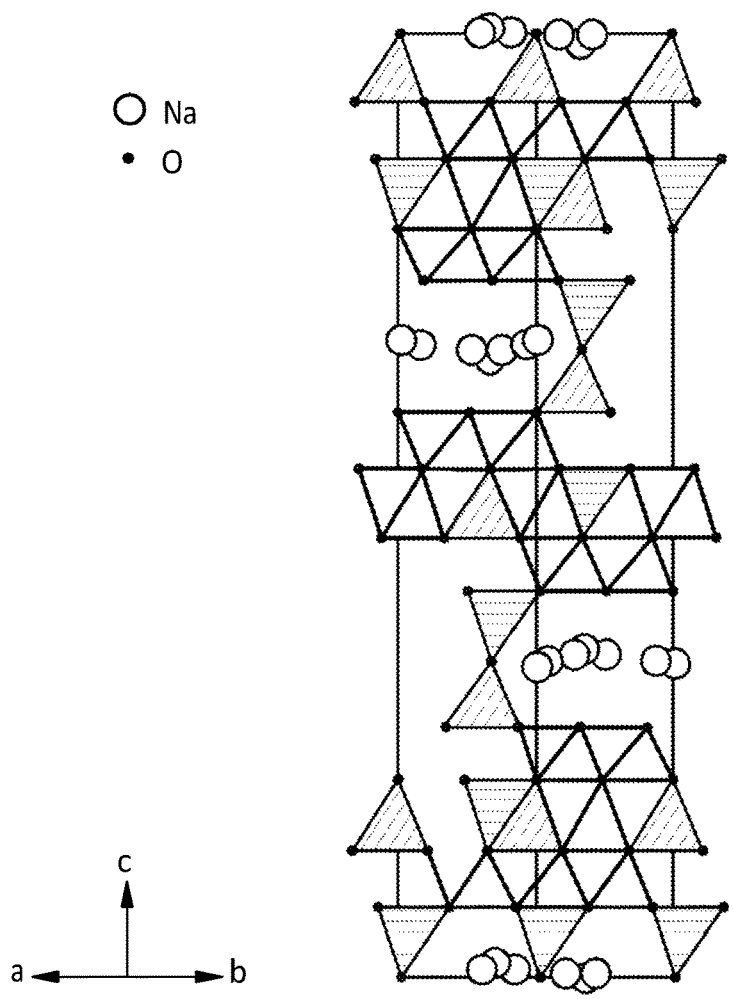
FIGS. 3 and 15 show results of energy-dispersive x-ray analysis of working examples of the phosphor.
FIGS. 4 and 16 show sections of the crystal structure of the phosphor.

FIG. 1 shows crystallographic data of $Na_{1+x+2y}Al_{11-x-y}Zn_xLi_yO_{17}:Eu$ with x=0.7 and y=0.3 (WE1). The crystal structure was determined and refined using x-ray diffraction data of a single crystal of the phosphor. The structure refinement included Na, Li, Al and O. It was assumed that Li, Al and Zn occupy the same crystallographic position, and so refinement was possible with inclusion of Li and Al only, especially since free refinement of three atoms that share a crystallographic position is not possible in a viable manner. However, energy-dispersive x-ray spectroscopy detected the presence of Zn in the phosphor. The results are shown in FIG. 3. Energy-dispersive x-ray spectroscopy serves for qualitative or semiquantitative detection of elements and not for quantitative detection, which explains the different values from the measurements conducted. Owing to its low molecular mass, Li cannot be detected by means of energy-dispersive x-ray spectroscopy. Moreover, experiments show that the phosphor WE1 does not form without the addition of lithium-containing reactants, especially $Li_2CO_3$, or zinc-containing reactants, especially ZnO. Instead, these syntheses led to colorless products which, on excitation with UV radiation, emit secondary radiation in the blue region of the electromagnetic spectrum. In order to achieve emission in the green spectral region and a small half-height width of the inventive phosphor $(AB)_{1+x+2y}Al_{11-x-y}(AC)_xLi_yO_{17}:Eu$, especially $Na_{1+x+2y}Al_{11-x-y}Zn_xLi_yO_{17}:Eu$, the presence of Li and AC, especially of Li and Zn, has thus been found to be essential.

FIG. 2 shows atom positions in the structure of $Na_{2.3}Al_{10}Zn_{0.7}Li_{0.3}O_{17}:Eu^{2+}$ (WE1). Within the structure, Li, Al and Zn occupied the crystallographic position Al4/Li4.

Figures 15, 16:
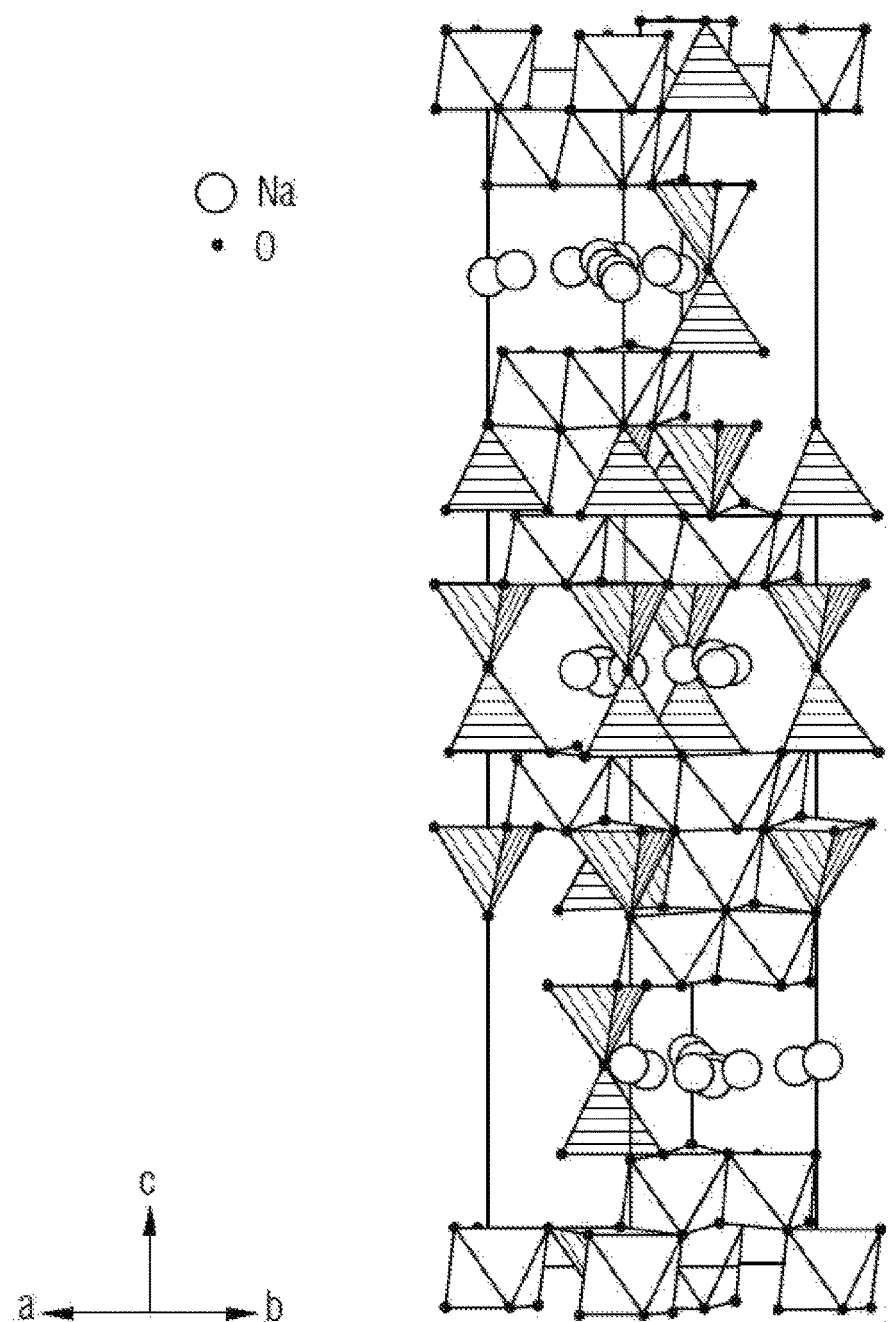

FIGS. 3 and 16 show the trigonal crystal structure of the phosphors $Na_{2.3}Al_{10}Zn_{0.7}Li_{0.3}O_{17}:Eu^{2+}$ and $Na_{2.1}Al_{10.2}Mg_{0.5}Li_{0.3}O_{17}:Eu^{2+}$ in a schematic diagram from somewhat different viewing directions, but both roughly about [001]. The crystal structure is composed of spinel-type blocks in which Al, Li and Zn or Al, Li and Mg occupy the centers (not shown) of edge- and vertex-linked octahedra ((Al,Li,Zn)$O_6$ octahedron or (Al,Li,Mg)$O_6$ octahedron) and the centers of vertex-linked tetrahedra ((Al,Li,Zn)O$_4$ tetrahedron or (Al,Li,Mg)O$_4$ tetrahedron). The spinel-type blocks are separated by planes having freely mobile Na ions. The crystal structure is isotypic to the crystal structure of sodium β"-aluminate. Al, Li and Zn, and Al, Li and Mg, respectively occupy the same position within the crystal structure as Al within the crystal structure of sodium β"-aluminate.

Figure 5:
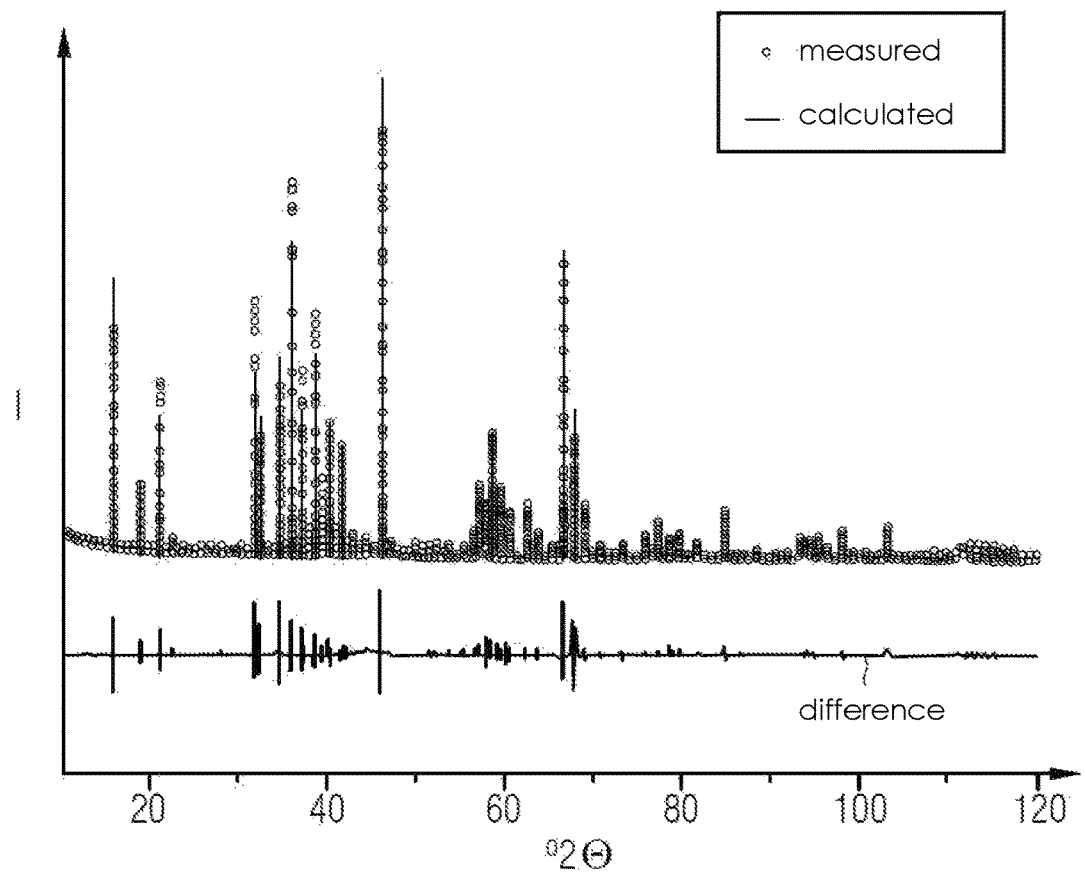
FIGS. 5 and 17 show Rietveld refinements of x-ray powder diffractograms of working examples of the phosphor.

In FIG. 5 is a crystallographic evaluation. FIG. 5 shows a Rietveld refinement of an x-ray powder diffractogram of the first working example WE1, i.e. for Na$_{1+x+2y}$Al$_{11-x-y}$Zn$_x$Li$_y$O$_{17}$:Eu with x=0.7 and y=0.3. For the Rietveld refinement, the atom parameters for sodium β"-aluminate were used in order to show that the crystal structure of Na$_{1+x+2y}$Al$_{11-x-y}$Zn$_x$Li$_y$O$_{17}$:Eu with x=0.7 and y=0.3 is isotypic to that of sodium β"-aluminate. The above diagram shows the superposition of the reflections measured with the calculated reflections for Na$_{1+x+2y}$Al$_{11-x-y}$Zn$_x$Li$_y$O$_{17}$:Eu with x=0.7 and y=0.3. The lower diagram shows the differences of the measured and calculated reflections. No secondary phases, especially no secondary phases containing Na, Zn, Li and O, are observed, and so it can be confirmed from the x-ray powder diffractogram that the phosphor contains all the reactants used. The differences in the intensity of the reflections are attributable to an as yet incomplete structure elucidation.

Figure 6:
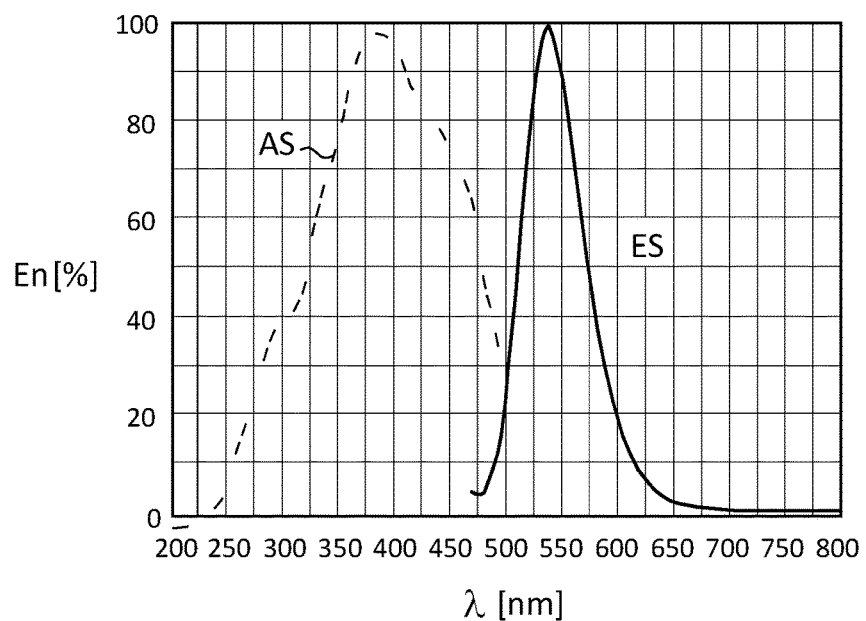
FIGS. 6 and 18 show absorption and emission spectra of working examples of the phosphor.

FIG. 6 shows the emission spectrum (ES) and the excitation spectrum (AS) of a powder sample of the first working example WE1 of the inventive phosphor having the empirical formula Na$_{2.3}$Al$_{10}$Zn$_{0.7}$Li$_{0.3}$O$_{17}$:Eu$^{2+}$. The excitation spectrum was recorded at 535 nm. In the case excitation of the phosphor with primary radiation of 460 nm, the phosphor shows a peak wavelength of about 535 nm with a half-height width of about 65 nm. The quantum efficiency is more than 90%. The color locus in the CIE color space is at the coordinates CIE-x:0.323 and CIE-y:0.633.

Figure 7:
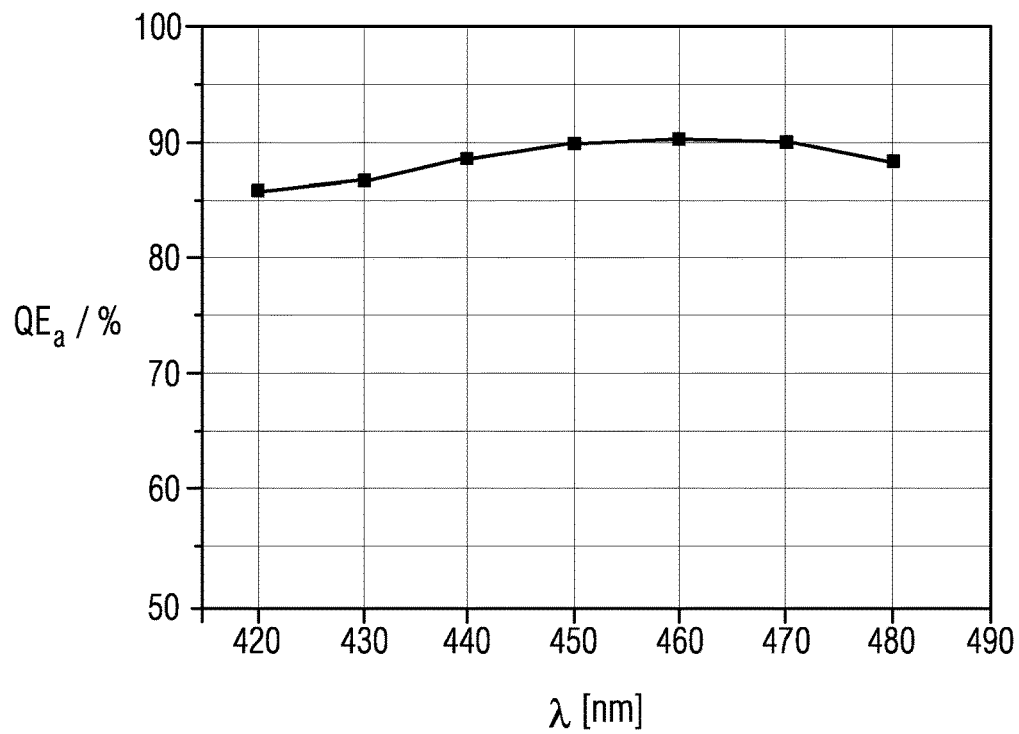
FIG. 7 shows the quantum efficiency as a function of the excitation wavelength of a working example of the phosphor.

FIG. 7 shows the absolute quantum efficiency (QE$_a$) of the first working example WE1 of the inventive phosphor having the empirical formula Na$_{2.3}$Al$_{10}$Zn$_{0.7}$Li$_{0.3}$O$_{17}$:Eu$^{2+}$ as a function of the excitation wavelength and hence the wavelength of the primary radiation. It is apparent that the phosphor can be efficiently excited up to at least a wavelength of the primary radiation of 480 nm. Variation of the concentration of Eu and optimization of the synthesis of the phosphor can lead to a further improvement in the optical properties of the phosphor.

Figure 8:
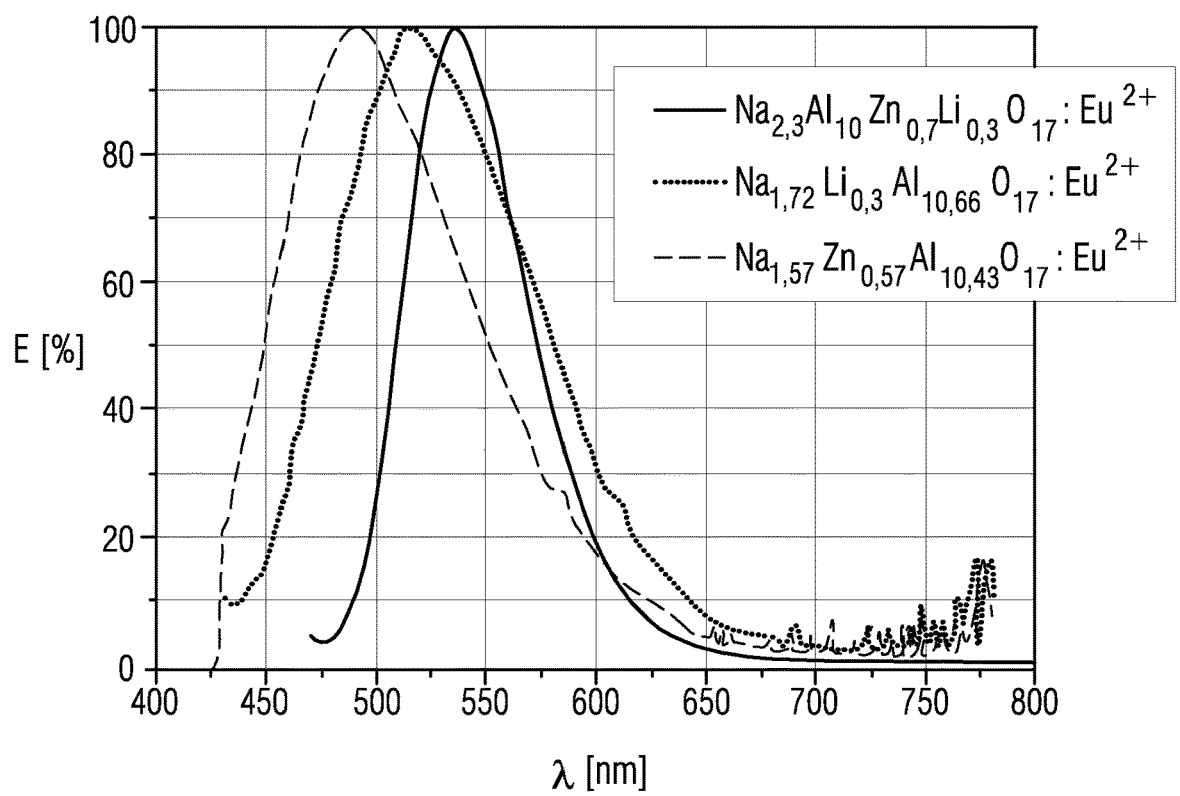
FIGS. 8, 10, 20 show a comparison of emission spectra.

FIG. 8 shows a comparison of emission spectra. The emission spectra of the first working example Na$_{2.3}$Al$_{10}$Zn$_{0.7}$Li$_{0.3}$O$_{17}$:Eu$^{2+}$ (excitation with primary radiation of 460 nm) and two further working examples Na$_{1.72}$Li$_{0.3}$Al$_{10.66}$O$_{17}$:Eu$^{2+}$ and Na$_{1.57}$Zn$_{0.57}$Al$_{10.43}$O$_{17}$:Eu$^{2+}$ (excitation with primary radiation of 400 nm) are shown. The undoped compounds Na$_{1.72}$Li$_{0.3}$Al$_{10.66}$O$_{17}$ and Na$_{1.57}$Zn$_{0.57}$Al$_{10.43}$O$_{17}$ are known from the literature and, just like the phosphors, crystallize in a crystal structure isotypic with sodium β"-aluminate. A comparison of the phosphors Na$_{2.3}$Al$_{10}$Zn$_{0.7}$Li$_{0.3}$O$_{17}$:Eu$^{2+}$ with Na$_{1.72}$Li$_{0.3}$Al$_{10.66}$O$_{17}$:Eu$^{2+}$ and Na$_{1.57}$Zn$_{0.57}$Al$_{10.43}$O$_{17}$:Eu$^{2+}$ shows that the phosphor containing both Li and Zn has a peak length closer to 555 nm and a smaller half-height width. This is shown by the comparison of the emission spectra. Na$_{1.72}$Li$_{0.3}$Al$_{10.66}$O$_{17}$:Eu$^{2+}$ and Na$_{1.57}$Zn$_{0.57}$Al$_{10.43}$O$_{17}$:Eu$^{2+}$ show a peak wavelength in the blue to blue/green region (λpeak=490 nm for Na$_{1.57}$Zn$_{0.57}$Al$_{10.43}$O$_{17}$:Eu$^{2+}$ and (λpeak=520 nm for Na$_{1.72}$Li$_{0.3}$Al$_{10.66}$O$_{17}$:Eu$^{2+}$) with a half-height width exceeding 100 nm, whereas the first working example surprisingly shows radiation with a peak wavelength in the green region (λpeak=535 nm) with a half-height width of about 65 nm. By contrast with Na$_{2.3}$Al$_{10}$Zn$_{0.7}$Li$_{0.3}$O$_{17}$:Eu$^{2+}$, Na$_{1.72}$Li$_{0.3}$Al$_{10.66}$O$_{17}$:Eu$^{2+}$ and Na$_{1.57}$Zn$_{0.57}$Al$_{10.43}$O$_{17}$:Eu$^{2+}$ are colorless solids.

Figure 9:
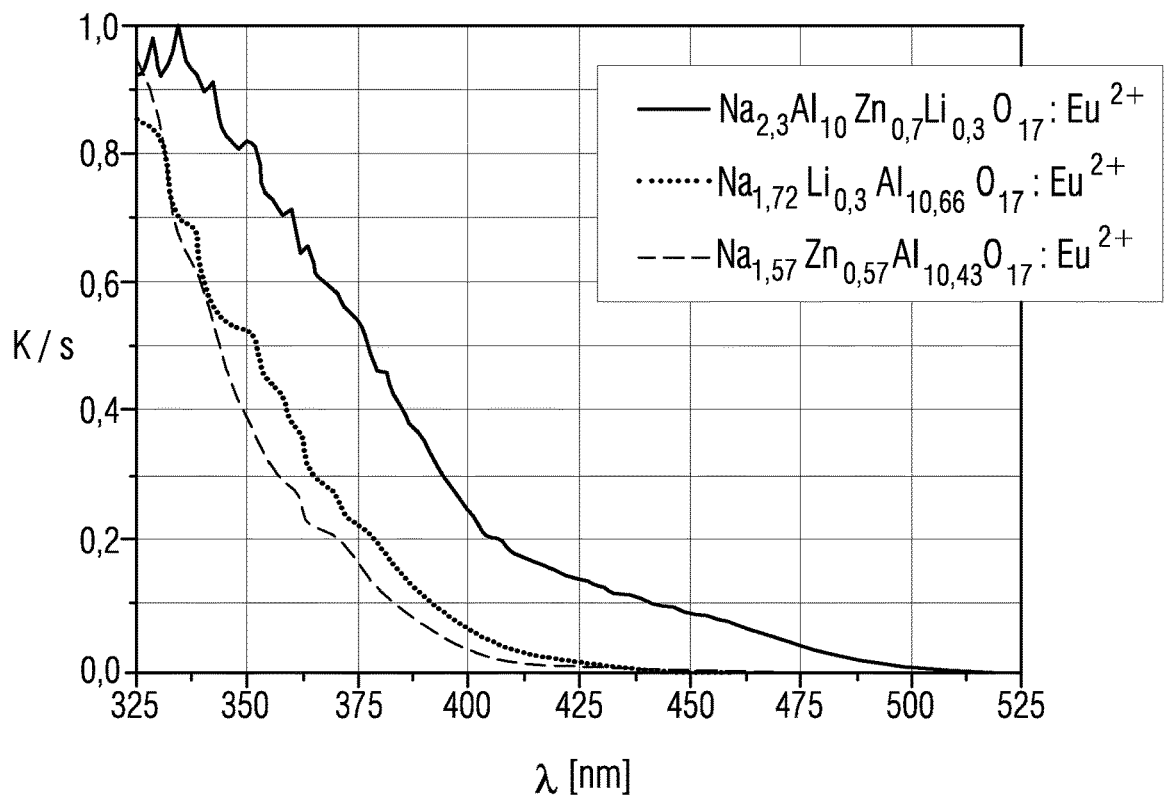
FIG. 9 shows the Kubelka-Munk functions for a working example of the phosphor and comparative examples.

FIG. 9 shows a comparison of the normalized Kubelka-Munk function (K/S), plotted against wavelength λ in nm, for the first working example (WE1) of the phosphor and the two further working examples Na$_{1.72}$Li$_{0.3}$Al$_{10.66}$O$_{17}$:Eu$^{2+}$ and Na$_{1.57}$Zn$_{0.57}$Al$_{10.43}$O$_{17}$:Eu$^{2+}$.

K/S was calculated here as follows:
K/S=(1−R$_{inf}$)$^2$/2R$_{inf}$ where R$_{inf}$ corresponds to the diffuse reflection (reflectance) of the phosphors. High K/S values mean high absorption in this region.

It is apparent from FIG. 9 that K/S for the working examples Na$_{1.72}$Li$_{0.3}$Al$_{10.66}$O$_{17}$:Eu$^{2+}$ and Na$_{1.57}$Zn$_{0.57}$Al$_{10.43}$O$_{17}$:Eu$^{2+}$ drops more steeply toward longer wavelengths than for the first working example of the phosphor and no longer shows any absorption from about 425 nm, whereas the first working example has significant absorption up to 500 nm.

Figure 10:
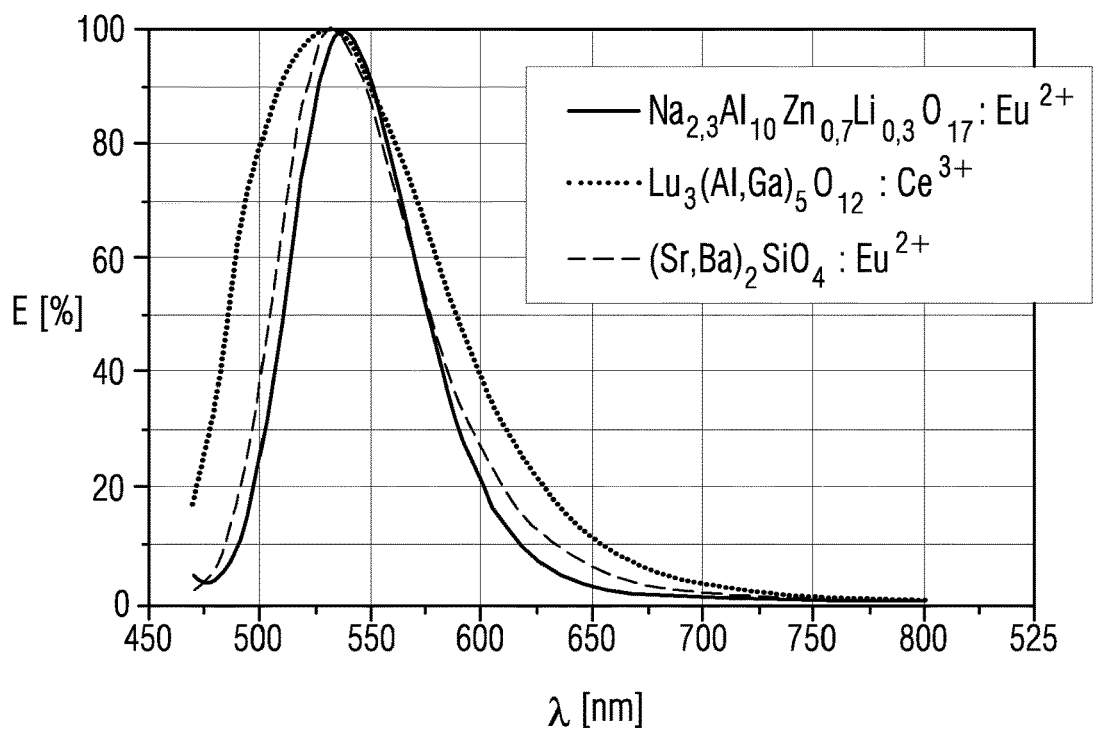

FIG. 10 shows the emission spectra of powder samples of the first working example (WE1) of the phosphor and two comparative examples Lu$_3$(Al,Ga)$_5$O$_{12}$:Ce$^{3+}$ and (Sr,Ba)$_2$SiO$_4$:Eu$^{2+}$. All phosphors were excited with primary radiation of 460 nm. All three phosphors show a similar dominant wavelength in the region of 555 nm. It is apparent that the inventive phosphor Na$_{2.3}$Al$_{10}$Zn$_{0.7}$Li$_{0.3}$O$_{17}$:Eu$^{2+}$ has a smaller half-height width than the comparative examples. The smaller half-height width leads to an increase in overlap with the eye sensitivity curve. Thus, the inventive phosphor has a luminescence efficiency or light yield which is very high, and higher compared to the comparative examples. The smaller half-height width additionally leads to a more saturated color of the secondary radiation, which is reflected in a higher color purity.

The dominant wavelength is a means of describing non-spectral (polychromatic) light mixtures in terms of spectral (monochromatic) light that produces a similar perceived shade. In the CIE color space, the line that connects a point for a particular color and the point CIE-x=0.333, CIE-y=0.333 can be extrapolated such that it meets the outline of the space at two points. The point of intersection closer to said color represents the dominant wavelength of the color as the wavelength of the pure spectral color at this point of intersection. The dominant wavelength is thus the wavelength that is perceived by the human eye.

FIG. 11 shows a comparison of the optical data of the first working example (WE1) of the phosphor and the two comparative examples Lu$_3$(Al,Ga)$_5$O$_{12}$:Ce$^{3+}$ and (Sr,Ba)$_2$SiO$_4$:Eu$^{2+}$. It is apparent that WE1 shows a relative quantum efficiency above 100% and hence is much higher than that of the comparative examples. This is also significant in particular in that the phosphor has not been optimized with regard to the synthesis.

Figure 12:
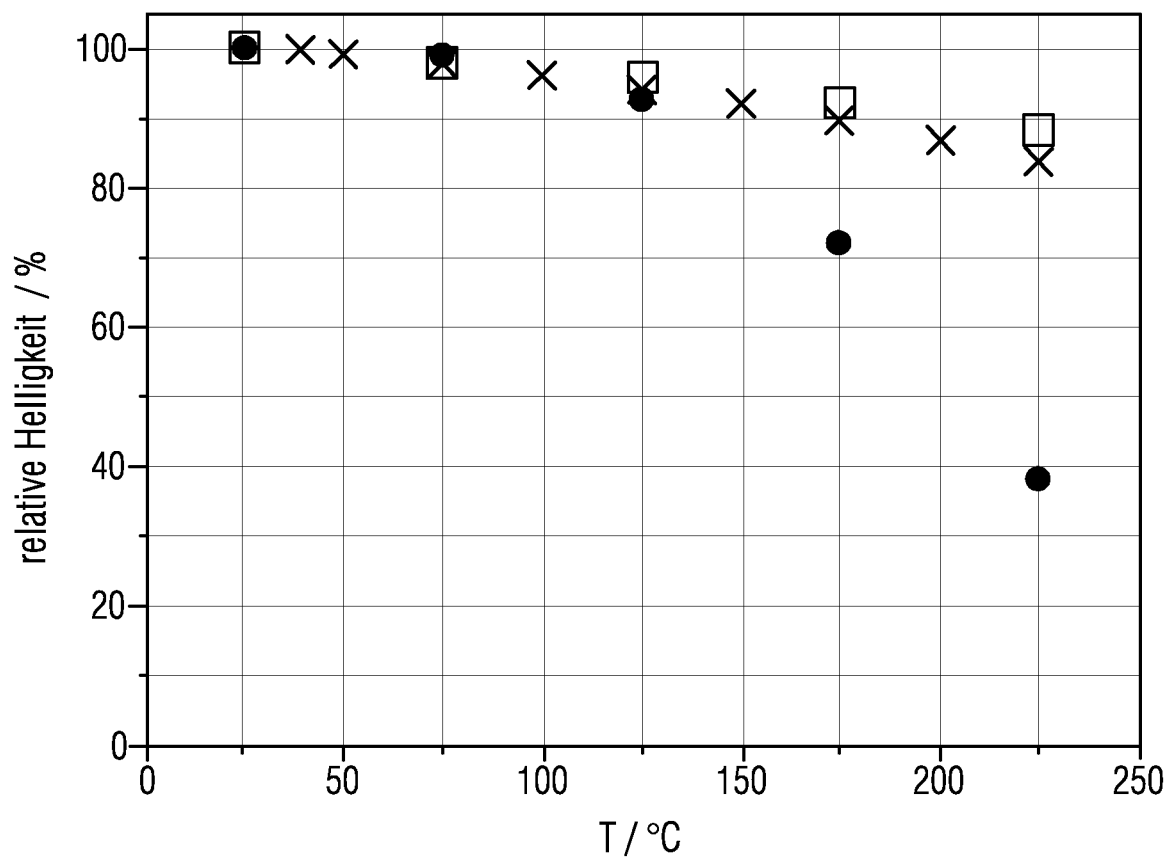
FIG. 12 shows the thermal quenching characteristics of a working example of the phosphor.

In FIG. 12, relative brightness in % is plotted against temperature in ° C. It is a comparison of the thermal quenching characteristics of the inventive phosphor WE1 by comparison with the two comparative examples Lu$_3$(Al,Ga)$_5$O$_{12}$:Ce$^{3+}$ and (Sr,Ba)$_2$SiO$_4$:Eu$^{2+}$. It is apparent that the first working example Na$_{2.3}$Al$_{10}$Zn$_{0.7}$Li$_{0.3}$O$_{17}$:Eu$^{2+}$ of the phosphor has higher thermal stability than (Sr,Ba)$_2$SiO$_4$ and comparable thermal stability to Lu$_3$(Al,Ga)$_5$O$_{12}$:Ce$^{3+}$. The phosphors have been excited with blue primary radiation having a wavelength of 460 nm at different temperatures of 25 to 225° C. and their relative brightness has been recorded. The inventive phosphor WE1 is suitable for use thereof in conversion LEDs in which the phosphor may typically be subjected to higher temperatures, for example up to 140° C.

Advantageously, the phosphor may thus also be used at higher operating temperatures in conversion LEDs.

FIG. 13 shows crystallographic data of $Na_{1+x+2y}Al_{11-x-y}Mg_xLi_yO_{17}$:Eu with x=0.5 and y=0.3 (WE2). The crystal structure was determined and refined using x-ray diffraction data of a single crystal of the phosphor. The structure refinement included Na, Mg, Al and O. It was assumed that Li, Al and Mg occupy the same crystallographic position, and so refinement was possible including Mg and Al only, especially since refinement of three atoms that share a crystallographic position is not possible in a viable manner. Energy-dispersive x-ray spectroscopy detected the presence of Mg in the phosphor. The results are shown in FIG. 15. Energy-dispersive x-ray spectroscopy serves for qualitative or semiquantitative detection of elements; conclusions as to the exact quantity of the elements cannot be made therefrom. The particular values should thus not be regarded as percentages with respect to the exact quantity of the elements. Owing to its low molecular mass, Li cannot be detected by means of energy-dispersive x-ray spectroscopy. Moreover, comparative experiments show that the phosphor does not form without the addition of lithium-containing reactants, especially $Li_2CO_3$. The use of a lithium-containing reactant, especially $Li_2CO_3$, is thus found to be essential for the formation of the phosphor WE2. Synthesis without $Li_2CO_3$ led to a colorless product that emits secondary radiation in the blue region of the electromagnetic spectrum on excitation with UV radiation. In order to achieve emission in the green spectral region and a small half-height width of $(AB)_{1+x+2y}Al_{11-x-y}(AC)_xLi_yO_{17}$:Eu, especially $Na_{1+x+2y}Al_{11-y}Mg_xLi_yO_{17}$:Eu, the presence of Li and AC, especially of Li and Mg, has thus been found to be essential.

FIG. 14 shows atom positions in the structure of $Na_{2.1}Al_{10.2}Mg_{0.5}Li_{0.3}O_{17}$:$Eu^{2+}$ (WE2). Within the structure, Li, Al and Mg occupied the crystallographic position Al3/Mg3.

Figure 17:
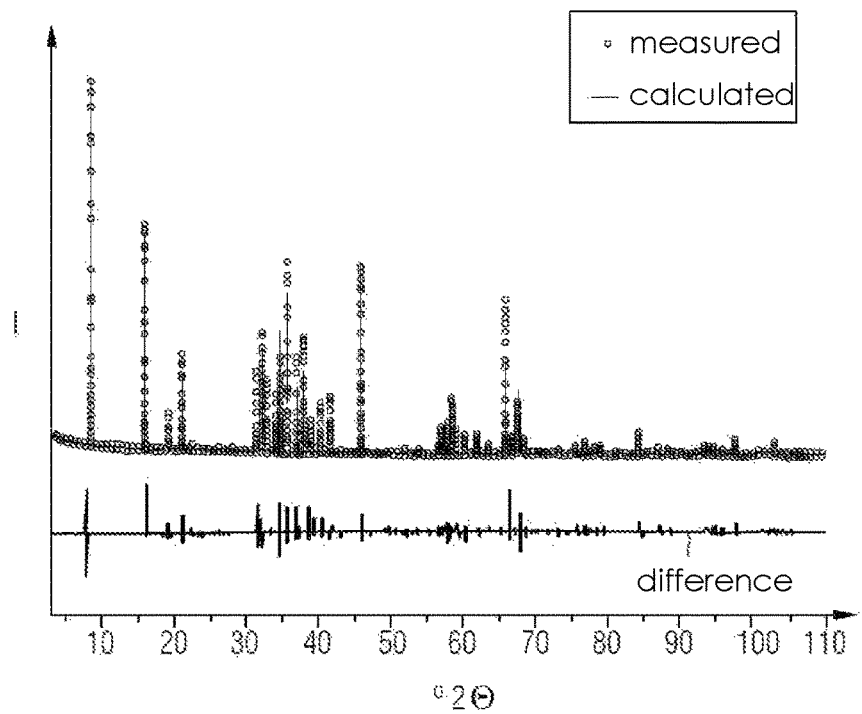

In FIG. 17 there is a crystallographic evaluation. FIG. 17 shows a Rietveld refinement of the x-ray powder diffractogram of the second working example WE2, i.e. for $Na_{2.1}Al_{10.2}Mg_{0.5}Li_{0.3}O_{17}$:$Eu^{2+}$. For the Rietveld refinement, the atom parameters for sodium β"-aluminate were used, in order to show that the crystal structure of $Na_{2.1}Al_{10.2}Mg_{0.5}Li_{0.3}O_{17}$:$Eu^{2+}$ is isotypic with that of sodium β"-aluminate. The upper diagram shows the superposition of the reflections measured with the reflections calculated for $Na_{2.1}Al_{10.2}Mg_{0.5}Li_{0.3}O_{17}$:$Eu^{2+}$. The lower diagram shows the differences of the reflections measured and calculated. No secondary phases are observed; more particularly, no secondary phases containing Na, Mg, Li and O are formed, and so it can be confirmed from the x-ray powder diffractogram that the phosphor contains all the reactants used. The differences in the intensity of the reflections are attributable to an as yet incomplete structure elucidation.

Figure 18:
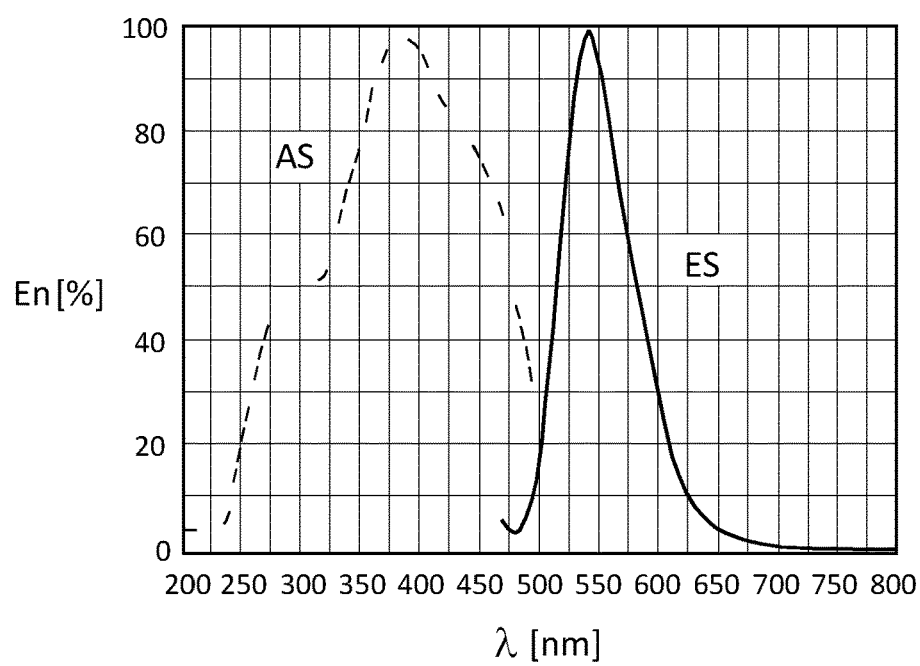

FIG. 18 shows the emission spectrum (ES) and the excitation spectrum (AS) of a powder sample of the second working example WE2 of the phosphor having the empirical formula $Na_{2.1}Al_{10.2}Mg_{0.5}Li_{0.3}O_{17}$:$Eu^{2+}$. The excitation spectrum was recorded at 535 nm. On excitation of the phosphor with primary radiation at 460 nm, the phosphor shows a peak wavelength of about 543 nm with a half-height width of about 70 nm. The quantum efficiency is more than 89%. The color locus in the CIE color space is at the coordinates CIE-x:0.374 and CIE-y:0.599.

Figure 19:
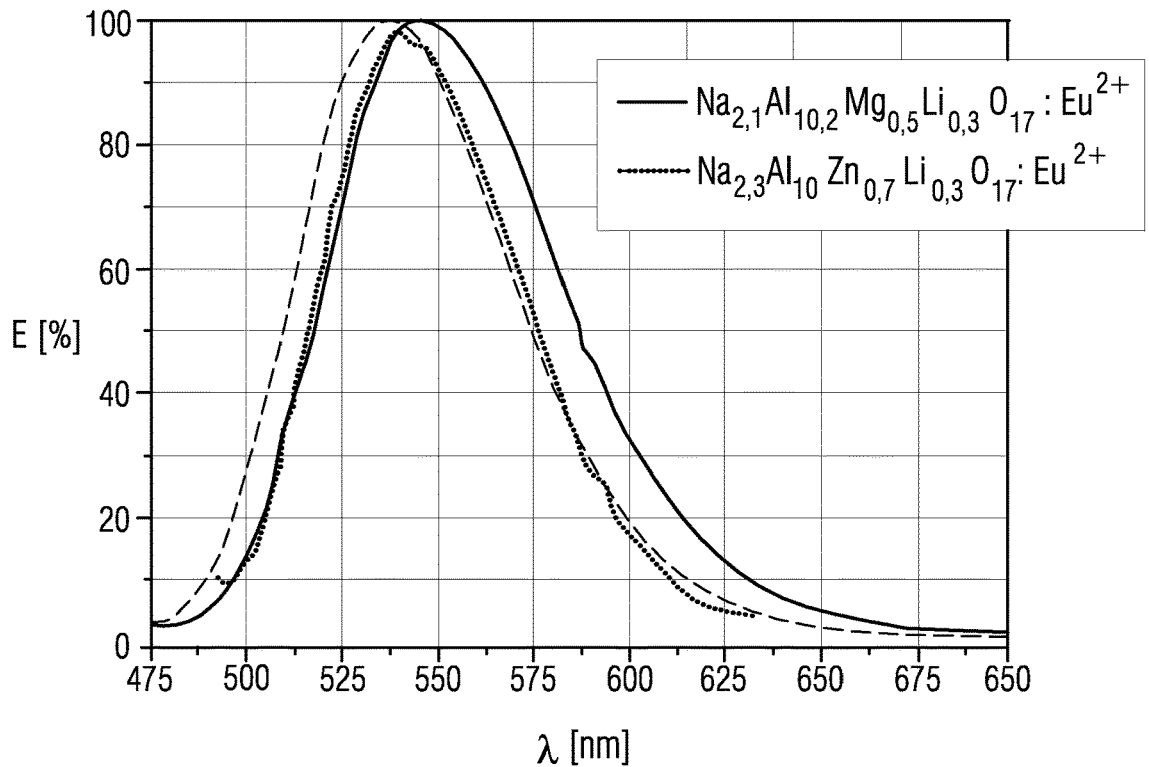
FIG. 19 shows emission spectra of working examples of the phosphor.

FIG. 19 shows a comparison of emission spectra of the first and second working examples. The phosphors were excited with primary radiation of wavelength 460 nm. The substitution of Zn for Mg results in a shift in the peak wavelength toward longer wavelengths.

Figure 20:
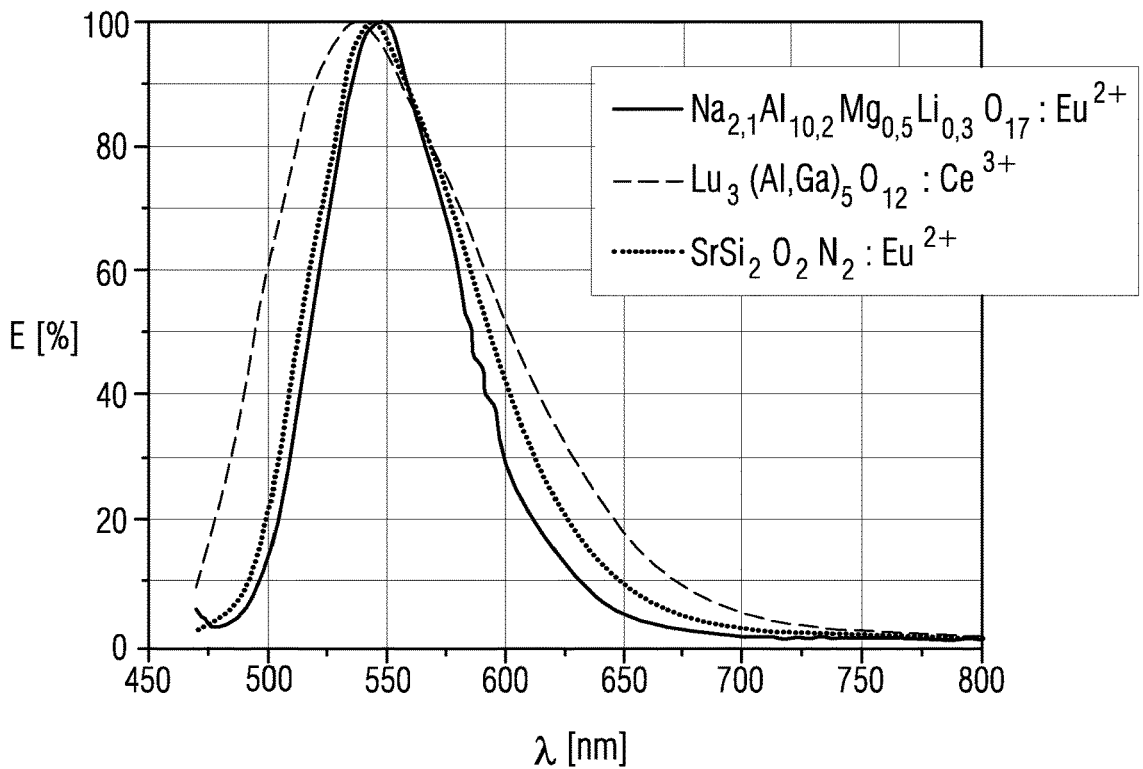

FIG. 20 shows the emission spectra of the second working example (WE2) of the phosphor and two comparative examples $Lu_3(Al,Ga)_5O_{12}$:$Ce^{3+}$ and $Sr_2Si_2O_2N_2$:$Eu^{2+}$. All three phosphors show a similar dominant wavelength in the region of 561 nm. It is apparent that the phosphor has a smaller half-height width than the comparative examples. The smaller half-height width leads to an increase in overlap with the eye sensitivity curve. Thus, the inventive phosphor $Na_{2.1}Al_{10.2}Mg_{0.5}Li_{0.3}O_{17}$:$Eu^{2+}$ has a luminescence efficiency or light yield which is very high, and higher compared to the comparative examples. The smaller half-height width additionally leads to a more saturated color of the secondary radiation, which is reflected in a higher color purity.

FIG. 21 shows a comparison of the optical data of the second working example (WE2) of the phosphor and two comparative examples $Lu_3(Al,Ga)_5O_{12}$:$Ce^{3+}$ and $Sr_2Si_2O_2N_2$:$Eu^{2+}$. It is apparent that WE2 shows a higher relative quantum efficiency than $Sr_2Si_2O_2N_2$:$Eu^{2+}$. This is significant in particular in that the phosphor has not been optimized with regard to the synthesis, and so, after an optimized synthesis, the quantum efficiency could be higher than for $Lu_3(Al,Ga)_5O_{12}$:$Ce^{3+}$.

Figure 22:
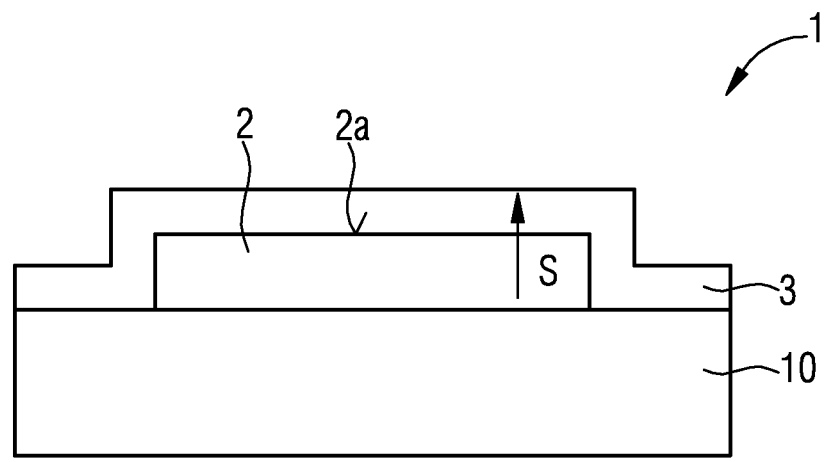
FIGS. 22 and 23 show schematic side views of conversion LEDs.

The conversion LED according to FIG. 22 has a layer sequence 2 disposed on a substrate 10. The substrate 10 may, for example, be reflective. Above the layer sequence 2 is disposed a conversion element 3 in the form of a layer. The layer sequence 2 has an active layer (not shown) which, in operation of the conversion LED, emits a primary radiation having a wavelength of 420 nm and 500 nm inclusive. The conversion element is disposed in the beam path of the primary radiation S. The conversion element 3 includes a matrix material, for example a silicone, and particles of the phosphor $Na_{2.1}Al_{10.2}Mg_{0.5}Li_{0.3}O_{17}$:$Eu^{2+}$ having an average grain size of 10 μm, which converts the primary radiation in operation of the conversion LED at least partly to a secondary radiation in the green region of the electromagnetic spectrum. In the conversion element 3, the phosphor is distributed homogeneously within the scope of manufacturing tolerance in the matrix material. The conversion element 3 has been applied over the full area of the radiation exit surface 2a of the layer sequence 2 and over the lateral faces of the layer sequence 2, and is in direct mechanical contact with the radiation exit surface 2a of the layer sequence 2 and the lateral faces of the layer sequence 2. The primary radiation can also exit via the lateral faces of the layer sequence 2.

The conversion element 3 may be applied, for example, by injection molding or compression-injection molding, or by spray-coating methods. In addition, the conversion LED has electrical contacts (not shown), the formation and arrangement of which is known to the person skilled in the art.

Figure 23:
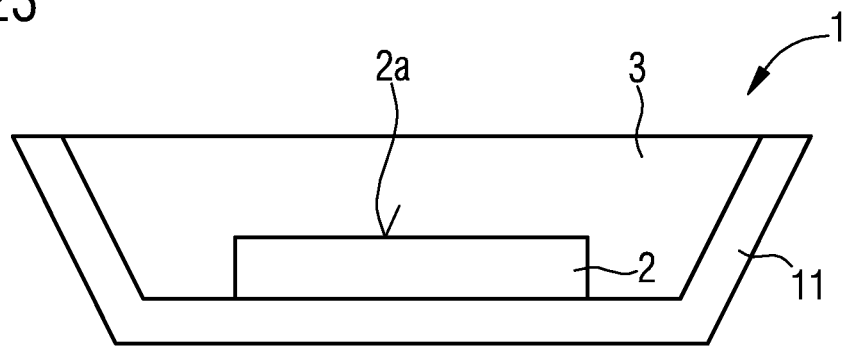

The conversion LED 1 according to FIG. 23 has a housing 11 with a recess. Disposed in the recess is a layer sequence 2 having an active layer (not shown) which, in operation of the conversion LED, emits primary radiation having a wavelength of 420 to 500 nm. The conversion element 3 takes the form of an encapsulation of the layer sequence 2 in the recess and includes a matrix material, for example a silicone, and a phosphor, for example $Na_{2.3}Al_{10}Zn_{0.7}Li_{0.3}O_{17}$:$Eu^{2+}$, which converts the primary radiation in operation of the conversion LED 1 at least partly to secondary radiation in the green region of the electromagnetic spectrum. It is also possible that the phosphor in the conversion element 3 is spatially concentrated above the radiation exit surface 2a. This can be achieved, for example, by sedimentation.

The invention is not limited to the working examples by the description with reference thereto. Instead, the invention includes every new feature and every combination of features, which especially includes any combination of features in the claims, even if this feature or this combination itself is not specified explicitly in the claims or working examples.

LIST OF REFERENCE NUMERALS ppm parts per million
$\lambda$dom dominant wavelength
$\lambda$peak peak wavelength
$\lambda$ wavelength
FWHM half-height width
LER light yield
$QE_a$ absolute quantum efficiency
$QE_r$ relative quantum efficiency
AS excitation spectrum
ES emission spectrum
K/S Kubelka-Munk function
t time
T temperature
I intensity
° C. degrees Celsius
E emission
En energy
LED light-emitting diode
nm nanometer
lm lumen
W watt
° 2$\theta$ degrees 2 theta
1 conversion LED
2 layer sequence/semiconductor chip
2a radiation exit surface
3 conversion element
10 substrate
11 housing
S beam path of primary radiation

The invention claimed is:
1. A phosphor having an empirical formula $(AB)_{1+x+2y}Al_{11-x-y}(AC)_xLi_yO_{17}:E$; wherein:
$0<x+y<11$;
AC=Mg, Ca, Sr, Ba, Zn, or combinations thereof;
AB=Na, K, Rb, Cs, or combinations thereof; and
E=Eu, Ce, Yb, Mn, or combinations thereof.
2. A phosphor as claimed in claim 1, wherein
x>0; and
y>0.
3. A phosphor as claimed in claim 2, wherein the empirical formula is $Na_{1+x+2y}Al_{11-x-y}(AC)_xLi_yO_{17}:E$.
4. A phosphor as claimed in claim 2, wherein the empirical formula is $Na_{1+x+2y}Al_{11-x-y}(Zn_{1-z}A_z)_xLi_yO_{17}:E$; wherein $0 \le z < 1$;
and wherein A=Mg, Ca, Sr, Ba, or combinations thereof.
5. A phosphor as claimed in claim 2, wherein the empirical formula is $Na_{1+x+2y}Al_{11-x-y}Zn_xLi_yO_{17}:E$.
6. A phosphor as claimed in claim 2, wherein the empirical formula is $Na_{1+x+2y}Al_{11-x-y}(Mg_{1-z'}A'_{z'})_xLi_yO_{17}:E$; wherein $0 \le z' < 1$;
and wherein A'=Zn, Ca, Sr, Ba, and combinations thereof.
7. A phosphor as claimed in claim 2, wherein the empirical formula is $Na_{1+x+2y}Al_{11-x-y}Mg_xLi_yO_{17}:E$.
8. A phosphor as claimed in claim 2, wherein the phosphor crystallizes in a trigonal crystal system.
9. A phosphor as claimed in claim 2, wherein the phosphor crystallizes in a $R\bar{3}$ space group.
10. A phosphor as claimed in claim 1, wherein $0<x+y<2$.
11. A process for preparing a phosphor as claimed in claim 1, wherein the process comprises:
blending reactants of the phosphor to form a blend;
heating the blend to a temperature ranging from 1200 to 1800° C.;
calcining the blend at a temperature ranging from 1200 to 1800° C. for an amount of time ranging from 6 hours to 15 hours.
12. A conversion LED component comprising:
a primary radiation source configured to emit electromagnetic primary radiation; and
a conversion element comprising a phosphor as claimed in claim 1;
wherein the conversion element is arranged in a beam path of the electromagnetic primary radiation and the phosphor is configured to convert the electromagnetic primary radiation at least partly to an electromagnetic secondary radiation in the blue to green region of the electromagnetic spectrum.
13. The conversion LED component as claimed in claim 12, wherein the conversion LED component emits white total radiation in operation, and wherein the conversion element comprises a white phosphor configured to convert the electromagnetic primary radiation and/or the electromagnetic secondary radiation in the blue to green region at least partly to an electromagnetic radiation in the red region of the electromagnetic spectrum, and wherein the white total radiation is composed of the primary and secondary radiations.
14. The conversion LED component as claimed in claim 12, wherein the conversion LED component in operation emits blue to green total radiation, wherein the blue to green total radiation corresponds to the secondary radiation.

* * * * *

UNITED STATES PATENT AND TRADEMARK OFFICE
CERTIFICATE OF CORRECTION

PATENT NO. : 11,613,697 B2  Page 1 of 1
APPLICATION NO. : 16/753799
DATED : March 28, 2023
INVENTOR(S) : Alexey Marchuk et al.

It is certified that error appears in the above-identified patent and that said Letters Patent is hereby corrected as shown below:

In the Claims

Column 16, Line 18; Please change "in a $R\bar{3}$ space group" to --in a $R\bar{3}m$ space group--

Signed and Sealed this
Twenty-third Day of May, 2023

Katherine Kelly Vidal
*Director of the United States Patent and Trademark Office*